United States Patent
Haley et al.

(10) Patent No.: US 6,806,020 B2
(45) Date of Patent: Oct. 19, 2004

(54) NEGATIVE WORKING IMAGEABLE COMPOSITION CONTAINING SULFONIC ACID

(75) Inventors: Neil Haley, Wellington, CO (US); John Kalamen, Loveland, CO (US)

(73) Assignee: Kodak Polychrome Graphics LLC, Norwalk, CT (US)

( * ) Notice: Subject to any disclaimer, the term of this patent is extended or adjusted under 35 U.S.C. 154(b) by 0 days.

(21) Appl. No.: 09/933,864

(22) Filed: Aug. 21, 2001

(65) Prior Publication Data

US 2003/0082474 A1 May 1, 2003

(51) Int. Cl.⁷ .......................... G03F 7/021; G03F 7/30
(52) U.S. Cl. .................. 430/175; 430/157; 430/176; 430/270.1; 430/302
(58) Field of Search .................. 430/157, 175, 430/176, 270.1, 302

(56) References Cited

U.S. PATENT DOCUMENTS

| | | | | |
|---|---|---|---|---|
| 4,248,959 A | * | 2/1981 | Jeffers et al. | 430/300 |
| 4,486,529 A | * | 12/1984 | Jeffers et al. | 430/300 |
| 5,340,699 A | | 8/1994 | Haley et al. | 430/302 |
| 5,401,607 A | * | 3/1995 | Takiff et al. | 430/253 |
| 5,536,616 A | | 7/1996 | Frechet et al. | 430/191 |
| 5,641,608 A | | 6/1997 | Grunwald et al. | 430/302 |
| 5,650,261 A | * | 7/1997 | Winkle | 430/270.1 |
| 5,763,134 A | | 6/1998 | Busman et al. | 430/157 |
| 5,919,601 A | | 7/1999 | Nguyen et al. | 430/278.1 |
| 5,932,393 A | * | 8/1999 | Cunningham et al. | 430/281.1 |
| 5,965,319 A | | 10/1999 | Kobayashi | 430/176 |
| 6,042,987 A | | 3/2000 | Kobayashi | |
| 6,242,101 B1 | * | 6/2001 | Schwalm et al. | 428/425.8 |
| 6,406,829 B1 | * | 6/2002 | Tachikawa et al. | 430/270.1 |
| 6,416,928 B1 | * | 7/2002 | Ohsawa et al. | 430/270.1 |
| 6,423,462 B1 | | 7/2002 | Kunita | |

FOREIGN PATENT DOCUMENTS

| | | | |
|---|---|---|---|
| JP | 1078249 | A2 | 3/1989 |
| JP | 3291665 | A2 | 12/1991 |
| JP | 10039509 | A2 | 2/1998 |
| JP | 10193554 | A2 | 7/1998 |
| JP | 11268438 | A2 | 10/1999 |

* cited by examiner

*Primary Examiner*—John S. Chu
(74) *Attorney, Agent, or Firm*—Faegre & Benson LLP

(57) ABSTRACT

The present invention provides a thermally imageable composition, which includes an acid curable composition, an acid generator, a strong acid and optionally an infrared absorber. The present invention further provides an imageable element, which includes a substrate and a thermally imageable composition according to the present invention coated on a surface of the substrate. Also provided are methods of producing an imaged element according to the present invention.

57 Claims, No Drawings

NEGATIVE WORKING IMAGEABLE COMPOSITION CONTAINING SULFONIC ACID

FIELD OF THE INVENTION

The present invention relates to an imageable composition. More particularly, the present invention relates to a thermally imageable composition having an acid curable composition, an acid generator, a strong acid and optionally an infrared absorber. As the strong acid, sulfonic acids are added to increase the speed of the thermally imageable, pre-heated, negatively working patterning compositions, which are useful especially as printing plates.

DESCRIPTION OF THE PRIOR ART

Printing plates having a coating of a thermally imageable composition that includes an acid curable composition and either a "free acid" cure catalyst or a "latent acid" cure catalyst, such as, an acid generator, are known. However, each of these systems suffers from disadvantages, which include difficulty of controlling the cure rates.

If a "free acid" cure catalyst is used in an amount sufficient to produce a satisfactory cure speed, the shelf life of the curable composition becomes severely limited because the curing process begins immediately upon contact of the free acid with the ingredients of the acid curable composition. If, on the other hand, lesser amounts of the cure catalyst are employed to improve the shelf life, the cure rate is reduced to unacceptably low levels.

In an alternative approach, if a "latent acid" cure catalyst is used in an amount sufficient to produce a satisfactory cure speed, the amount of energy required to generate the acid from the acid generator compound is unacceptably high even though the shelf life of the curable composition is satisfactory. If, on the other hand, lesser amounts of the "latent" cure catalyst were employed to improve the energy requirements of the acid generator, the cure rate would be reduced to unacceptably low levels.

U.S. Pat. No. 5,965,319 describes a negatively working composition having an IR absorber, novolak and resole resins, and an iodonium, sulfonium or diazonium salt, with a sulfonate group as counterion. There is no teaching that the presence of sulfonic acid as a discrete additive will improve cure rate processing latitude.

U.S. Pat. No. 6,042,987 describes a thermal negative system in which an acid is produced from a typical generator upon exposure to IR radiation. This promotes cross-linking between a novolak and a crosslinking species.

Japanese Patent Application JP 11-268,438 describes a thermal positive plate having a novolak resin and an IR absorber that has a thermally decomposable sulfonate directly attached thereto. At unimaged regions of the plate, the absorber acts as an insolubiliser and, at imaged areas, it acts as a dissolution accelerant. Japanese Patent Application JP 10-193,554 describes a negative plate having excellent run length by virtue of a new, improved polymer. Japanese Patent Application JP 3-291,665 discloses conventionally imaged negative plate systems.

U.S. Pat. Nos. 5,340,699 and 5,919,601 describe imageable compositions having a binder, a crosslinker, an acid generator and an infrared absorber. These patents do not describe the use of a strong acid in addition to the acid generator or that added sulfonic acids would improve plate speed or processing latitude.

U.S. Pat. No. 5,641,608 describes ablative and positive/negative working solubility differential systems for PCB precursors. The negative systems rely on adding an amine active ingredient just prior to use, or by employing a "UV flood then IR exposure" process. U.S. Pat. No. 5,763,134 describes a composition having an acid generator, typically a triazine, and a squarylium dye having a defined nucleus. European Patent Application EP 632,003 describes MeO- and Me- containing phenol compounds for use as improved heat curing additives in conventional positive plates.

None of the above disclosures teach or suggest that the presence of a strong acid, such as, a sulfonic acid, will improve cure rate processing latitude when included in the composition as a discrete additive.

Accordingly, it is an object of the present invention to improve the speed and processing robustness of thermal, pre-heated, negatively working patterning compositions, especially printing plates, while maintaining adequate shelf life.

The present invention provides such an imageable composition, which has an improved cure rate, long shelf life of the acid curable composition and moderate energy requirement of the acid generation step.

SUMMARY OF THE INVENTION

The present invention provides an imageable composition, which includes an acid curable composition, an acid generator and a strong acid.

The present invention further provides an imageable element, which includes a substrate and an imageable composition coated on a surface of the substrate. The composition includes an acid curable composition, an acid generator and a strong acid.

The present invention further provides methods of producing an imaged element.

The first of these methods, includes the steps of:
providing a thermally imageable element including a substrate and a thermally imageable composition coated on a surface of the substrate, the composition including an acid curable composition, an acid generator and a strong acid;
imagewise exposing the imageable element to heat with a hot stylus to produce an imagewise exposed element having exposed and unexposed regions;
baking the imagewise exposed element at a temperature and period of time sufficient to produce a cured element; and
contacting the cured element and a developer to remove the unexposed regions and thereby produce the imaged element.

The second of these methods, includes the steps of:
providing an imageable element including a substrate and an imageable composition coated on a surface of the substrate, the composition including an acid curable composition, an acid generator and a strong acid;
imagewise exposing the imageable element to radiation to produce an imagewise exposed element having exposed and unexposed regions;
baking the imagewise exposed element at a temperature and period of time sufficient to produce a cured element; and
contacting the cured element and a developer to remove the unexposed regions and thereby produce the imaged element.

It was found that incorporating a small amount of a sulfonic acid into pre-heat, thermal plate increases the speed of the thermal plate and allows maximum image density at wider pre-heat temperatures. In addition, it provides significantly improved processing latitude while maintaining an adequate shelf life.

DETAILED DESCRIPTION OF THE INVENTION

Lithographic printing plate precursors, i.e., imageable elements, typically include a radiation imageable coating applied over a support material, such as, an aluminum substrate. If after exposure to radiation, the exposed regions of the coating become soluble and are removed in the developing process, revealing the underlying hydrophilic surface of the support, the plate is called a positive-working printing plate. Conversely, if exposed regions of the plate become insoluble in the developer and the unexposed regions are removed by the developing process, the plate is called a negative-working plate. In each instance, the regions of the radiation-sensitive layer that remain (i.e., the image areas) are ink-receptive and the regions of the hydrophilic surface revealed by the developing process accept water and repel ink.

The present invention is useful in negative-working printing plates, such as Thermal Printing Plates/830, available from Kodak Polychrome Graphics, Norwalk, Conn. To improve cure rate and processing latitude of the thermally imageable layer, the present invention provides an imageable composition, which in addition to an acid generator includes as a discrete additive in the composition a strong acid, such as, a sulfonic acid. Thus, the imageable composition according to the present invention includes an acid curable composition, an acid generator, a strong acid and optionally an infrared absorber.

The term "hydrocarbyl" in the context of the present invention refers to a linear, branched or cyclic alkyl, alkenyl, aryl, aralkyl or alkaryl of 1 to 22 carbon atoms, substituted derivatives thereof, wherein the substituent group is selected from halogen, hydroxy, hydrocarbyloxy, carboxyl, ester, ketone, cyano, amino, amido and nitro groups. Hydrocarbyl groups in which the carbon chain is interrupted by oxygen, nitrogen or sulfur are also included in the term "hydrocarbyl".

Preferably, the imagable composition of the present invention is thermally imageable, so that the imageable element according to the present invention is infrared radiation imageable. Thus, in the method of the present invention, the step of imagewise exposing the imageable element to radiation is preferably carried out using an infrared radiation. Upon such imaging the developer solubility of the imaged area is decreased to allow differentiation between imaged and non-imaged areas upon development.

The acid curable composition can include a binder and a crosslinking agent for that binder. Suitable binders include polymers that have at least two, preferably more than two reactive groups, such as, hydroxy, carboxylic acid, amine, carbamate, amide, sulfonamide or imide. Preferably, the reactive group is a hydroxy group, such that, the polymer can be a polyol, a polyether polyol, a novolak resin, a hydroxyfunctional acrylic resin, a hydroxyfunctional polyester resin and combination thereof.

The crosslinking agent can be any suitable crosslinking agent known in the art and includes crosslinking agents, such as, a resole resin, an amino resin, an amido resin, an epoxy compound having at least two epoxide groups and the like. A combination of the aforementioned crosslinkers can also be used.

The crosslinking agent preferably is an amino resin that has at least two alkoxymethyl groups, including amino resins, such as, an alkoxymethylated melamine resin, an alkoxymethylated benzoguanamine resin, an alkoxymethylated glycoluril, an alkoxymethylated polyacrylamid, an alkoxymethylated polymethacrylamid and a combination thereof. Preferably, the alkyl group in the alkoxymethylated amino resins is derived from an alcohol of 1 to 4 carbon atoms, such as methanol, ethanol, propanol, butyl alcohol, isomers thereof and mixtures thereof. Examples of such amino resins include alkoxymethylated melamine resins having from about 2 to about 6 methoxymethyl groups.

The acid curable composition can include a self-crosslinking material, such as, a resole resin. However, in addition to the resole resin, the acid curable composition can further include a polymer having at least two reactive groups, such as, hydroxy, carboxylic acid, amine, carbamate, amide, sulfonamide or imide, to form a crosslinked network with the resole resin. Preferably, the acid curable composition includes a resole resin and a novolak resin.

The acid curable composition can further include an isocyanate crosslinker that has at least two, preferably more than two isocyanate groups. Such isocyanate crosslinkers include diisocyanates, such as, isophorone diisocyanate, methylene-bis-phenyl diisocyanate, toluene diisocyanate, hexamethylene diisocyanate, tetramethylxylylene diisocyanate, dimers thereof, adducts thereof with diols or triols, and mixtures thereof.

The imageable composition of the present invention also includes an acid generator, which is an ultraviolet, visible or infrared radiation or heat activated compound. Upon exposure to ultraviolet, visible radiation, infrared radiation or heat, either directly, or indirectly through heat transfer from an infrared absorbing compound, the acid generator produces a free acid, which acts as a cure catalyst for the curing process. Suitable acid generators include onium salts, covalently bound sulfonate group containing compounds, hydrocarbylsulfonamido-N-hydrocarbyl sulfonate and a combination thereof. Examples of the covalently bound sulfonate group containing compounds include hydrocarbyl sulfonates, such as, methyl tosylate, ethyl tosylate, benzoin tosylate, and the like.

When an ultraviolet radiation is used with a thermally activated acid generator, the composition can further include a photothermal converter material for converting ultraviolet energy to thermal energy. In addition, a UV/visible sensitizer selected from monomolecular or polymeric compounds containing an anthracene moiety, thioxanthone moiety or alkylaminobenzophenone moiety can also be used. However, in the case of UV-activated acid generators, the use of a photothermal converter material is not necessary.

Preferably, the acid generator is an onium salt that has a non-nucleophilic counteranion, such as, tetrafluoroborate, hexafluoroarsenate, hexafluoroantimonate, hexafluorophosphate, triflate, pentafluoroethyl sulfonate, tetrakis(pentafluorophenyl)borate, p-methylbenzene sulfonate, ethyl sulfonate, trifluoromethyl acetate and pentafluoroethyl acetate.

Examples of such onium salts include iodonium salts, sulfonium salts, hydrocarbyloxysulfonium salts, hydrocarbyloxyammonium salts, aryl diazonium salts and combinations thereof. Examples of the hydrocarbyloxy ammonium salts include the salts of N-hydrocarbyloxy substituted nitrogen containing heterocyclic compounds, such as, N-ethoxyisoquinolinium hexafluorophosphate. Examples of the iodonium salts include 4-octyloxyphenyl phenyliodonium hexafluoroantimonate.

Preferably, the acid generator is a monomeric or oligomeric aromatic diazonium salt. The monomeric and oligomeric diazonium salts can be any diazonium salt known in the art that is suitable for use in thermal imaging.

Suitable diphenylamine-4-diazonium salts include, for example, 4-diazodiphenylamine sulfate. However, any aromatic diazonium salt can be used. Examples of such aromatic diazonium salts include: diphenyl-4-diazonium chloride; 2-4-(N-(naphthyl-2-methyl)-N-propylamino)-benzenediazonium sulfate; chloro-diphenyl-4-diazonium chloride; 4-(3-phenylpropylamino)-benzenediazonium sulfate; 4-(N-ethyl-N-(benzyl)-amino)-benzenediazonium chloride; 4-(N,N-dimethyl-amino)-benzenediazonium tetrafluoroborate; 4-(N-(3-phenyl-mercapto-propyl)-N-ethylamino)-2-chlorobenzenediazonium chloride; 4-(4-methylphenoxy)-benzenediazonium sulfate; 4-(phenylmercapto)-benzenediazonium chloride; 4-phenoxybenzenediazonium chloride; 4-(benzoylamino)-benzenediazonium hexafluorophosphate; methylcarbazole-3-diazoniumchloride; 3-methyl-diphenyleneoxide-2-diazoniumchloride, 3-methyldiphenylamine-4-diazonium sulfate, 2,3',5-trimethoxydiphenyl-4-diazonium chloride; 2,4',5-triethoxydiphenyl-4-diazonium chloride; 4-(3-(3-methoxyphenyl)-propylamino)-benzenediazonium sulfate; 4-(N-ethyl-N-(4-methoxybenzyl)-amino)-benzenediazonium chloride; 4-(N-(naphthyl-(2)-methyl)-N-n-propylamino)methoxybenzenediazonium sulfate; 4-(N-(3-phenoxypropyl)-N-methylamino)-2,5-dimethoxybenzenediazonium tetrafluoroborate; 4-(N-(3-phenylmercaptopropyl)-N-ethylamino)-2-chloro-5-methoxybenzenediazonium chloride; 4-(4-(3-methylphenoxy)-phenoxy)-2,5-dimethoxybenzenediazonium sulfate; 4-(4-methoxyphenylmercapto)-2,5-diethoxybenzenediazonium chloride; 2,5-diethoxy-4-phenoxybenzenediazonium chloride; 4-(3,5-dimethoxybenzoylamino)-2,5-diethoxybenzenediazonium hexafluorophosphate; methoxycarbazole-3-diazonium chloride; 3-methoxy-diphenyleneoxide-2-diazonium chloride and methoxydiphenylamine-4-diazonium sulfate.

Diazonium salts derived from the following amines are also suitable for use in the present invention: 4-amino-3-methoxydiphenylamine, 4-amino-2-methoxydiphenylamine, 4'-amino-2-methoxydiphenylamine, 4'-amino-4-methoxydiphenylamine, 4-amino-3-ethoxydiphenylamine, 4-amino-3-hexyloxydiphenylamine, 4-amino-3-beta-hydroxyethoxy-diphenylamine, 4'-amino-2-methoxy-5-methyldiphenylamine, 4-amino-3-methoxy-6-methyldiphenylamine, 4'-amino-4-n-butoxydiphenylamine, 4'-amino-3',4-dimethoxydiphenylamine, 4-aminodiphenylamine, 4-amino-3-methyl-diphenylamine, 4-amino-3-ethyldiphenylamine, 4'-amino-3-methyl-diphenylamine, 4'-amino-4-methyl-diphenylamine, 4'-amino-3,3'-dimethyldiphenylamine, 3'-chloro-4-aminodiphenylamine, 4-aminodiphenylamine-2-sulfonic acid, 4-aminodiphenylamine-2-carboxylic acid, 4-aminodiphenylamine-2'-carboxylic acid and 4'-bromo-4-aminodiphenylamine. Preferred are 4-aminodiphenylamine, 3-methyl-4-aminodiphenylamine, 3-alkoxy-4-aminodiphenylamines having 1 to 3 carbon atoms in the alkoxy group and 3-methoxy-4-aminodiphenylamine.

Preferably, the counter anion of the aromatic diazonium salt can be mesitylene sulfonate, toluene sulfonate, methane sulfonate, naphthalene sulfonate, trifluoromethane sulfonate, hexafluorophosphate and tetrafluoroborate.

Examples of the particularly preferred monomeric aromatic diazonium salts include 2-methoxy-4-phenylaminobenzenediazonium hexafluorophosphate (diazo MSPF6) represented by the formula:

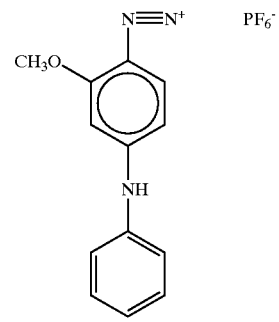

2-methoxy-4-phenylaminobenzenediazonium p-toluenesulfonate represented by the formula:

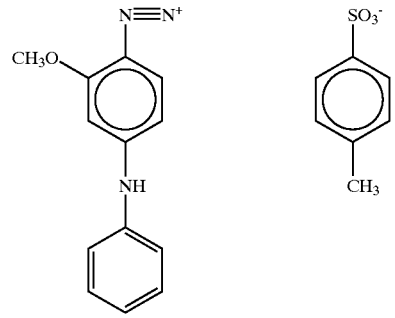

and a combination thereof.

Examples of the particularly preferred oligomeric aromatic diazonium salts include compounds represented by the formula:

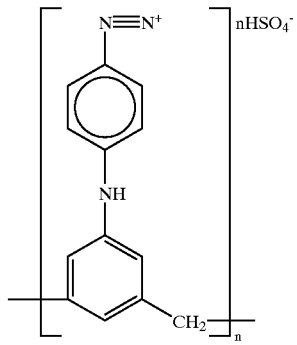

which is manufactured by St. Jean Photochemicals, Quebec, Canada, under the trade name DTS-18;

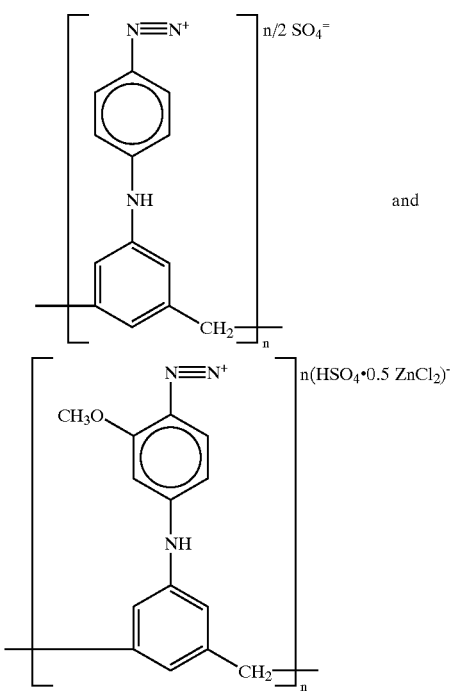

wherein n is from 1 to 11; and a combination thereof. Mixtures of any of the aforementioned diazonium salts are also suitable.

In addition to the acid generator, the imageable composition of the present invention includes an additional acid, which is a strong acid, typically introduced into the composition as the free acid. The term "strong acid" is defined herein as an acid that has a pKa of not more than about 8. Preferably, the strong acid of the present invention has a pKa of not more than about 5. More preferably, the strong acid of the present invention has a pKa of not more than about 4. Examples of such strong acids include sulfonic acids represented by the formula:

$$R\text{—}SO_3H$$

wherein R is a substituted or unsubstituted hydrocarbyl of 1 to 22 carbon atoms, a substituted or unsubstituted aryl of 6 to 22 carbon atoms. Mixtures of these acids can also be used to obtain desired cure rates and properties.

The alkyl sulfonic acids can be represented by the above formula, wherein the R group is preferably a linear, branched or cyclic alkyl of 1 to 22 carbon atom or a linear, branched or cyclic haloalkyl of 1 to 22 carbon atom having at least one halogen. Mixtures of these acids can also be used. Preferably, the haloalkyl group has two or more halogen atoms. Preferred halogens include chlorine and fluorine.

The aryl sulfonic acids can be represented by the formula:

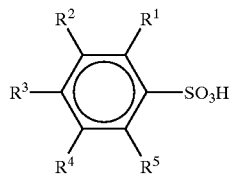

wherein each of $R^1$, $R^2$, $R^3$, $R^4$ and $R^5$ can independently be hydrogen, an alkyl of 1 to 12 carbon atoms, a haloalkyl of 1 to 22 carbon atoms having at least one halogen, an aryl of 6 to 12 carbon atoms, a halogen, a hydroxy, an alkoxy, a cyano, a nitro, an alkoxycarbonyl or an acyl group represented by the formula:

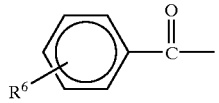

wherein $R^6$ can be hydrogen, alkyl of 1 to 12 carbon atoms, haloalkyl of 1 to 12 carbon atoms having at least one halogen atom, alkoxy, cyano, nitro, alkoxycarbonyl and acetyl.

Preferred aryl sulfonic acids can be represented by the formula:

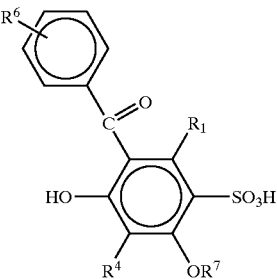

wherein each of $R^1$, $R^4$ and $R^6$ can be hydrogen, alkyl of 1 to 12 carbon atoms, haloalkyl of 1 to 12 carbon atoms having at least one halogen, aryl of 6 to 12 carbon atoms, halogen, hydroxy, alkoxy, cyano, nitro, alkoxycarbonyl or acyl and wherein $R^7$ can be hydrogen, alkyl of 1 to 12 carbon atoms, haloalkyl of 1 to 12 carbon atoms having at least one halogen, aryl of 6 to 12 carbon atoms, alkoxycarbonyl and acyl. An example of such an aryl sulfonic acid is 3-benzoyl-4-hydroxy-6-methoxybenzenesulfonic acid.

The imageable composition of the present invention can optionally include an infrared absorber, such as, a pigment, a dye or a combination thereof.

Examples of the preferred pigments include black pigments, yellow pigments, orange pigments, brown pigments, red pigments, purple pigments, blue pigments, green pigments, fluorescent pigments, metal powder pigments, polymer bond pigments, insoluble azo pigments, azo lake pigments, condensation azo pigments, chelate azo pigment, phthalocyanine pigments, anthraquinone pigments, perylene pigments, perynone pigments, thioindigo pigments, quinacridone pigments, dioxazine pigments, isoindolinone pigments, quinophthalone pigments, colored lake pigments, azine pigments, nitroso pigments, nitro pigments, natural pigments, fluorescent pigments, inorganic pigments, carbon black, Paris Blue, Prussian Blue or any combination thereof.

Examples of the preferred dyes include cyanine dyes, squarylium dyes, pyrylium salts and nickel thiolate complexes.

A particularly useful class of infrared absorbing dyes include compounds represented by the formula:

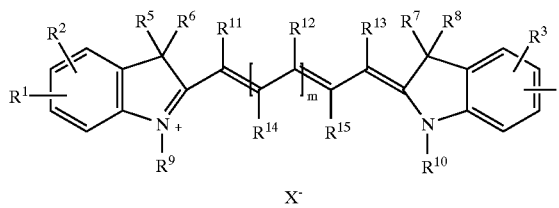

wherein each $R^1$, $R^2$, $R^3$ and $R^4$ is independently selected from the group consisting of: a linear, branched or cyclic alkyl of 1 to 12 carbon atoms, alkenyl of 1 to 12 carbon atoms, alkoxy of 1 to 12 carbon atoms in the alkyl and aryl of 1 to 12 carbon atoms;

wherein each pair selected from the group consisting of: $R^1$ and $R^2$ and $R^3$ and $R^4$ may be bonded together to form a fused aromatic ring;

wherein each $R^5$, $R^6$, $R^7$, $R^8$, $R^9$ and $R^{10}$ is independently selected from the group consisting of: a linear, branched or cyclic alkyl of 1 to 12 carbon atoms, wherein each of said alkyls can independently have a substituent;

wherein each $R^{11}$, $R^{12}$ and $R^{13}$ is independently selected from the group consisting of: hydrogen halogen, a linear, branched or cyclic alkyl of 1 to 8 carbon atoms, wherein each of said alkyls can independently have a substituent; wherein $R^{12}$ may be bonded to $R^{11}$ or $R^{13}$ to form a ring structure; and when m is greater than 2, a plurality of $R^{12}$ may bonded to each other to form a ring structure;

wherein each $R^{14}$ and $R^{15}$ is independently selected from the group consisting of: hydrogen halogen, a linear, branched or cyclic alkyl of 1 to 8 carbon atoms, wherein each of said alkyls can independently have a substituent; wherein $R^{14}$ may be bonded to $R^{15}$ to form a ring structure; and when m is greater than 2, a plurality of $R^{14}$ may bonded to each other to form a ring structure; and wherein m is an integer from 1 to 8; and $X^-$ is a counter arion derived from a non-volatile acid.

Specific examples of such dyes include the following compounds:

(1)

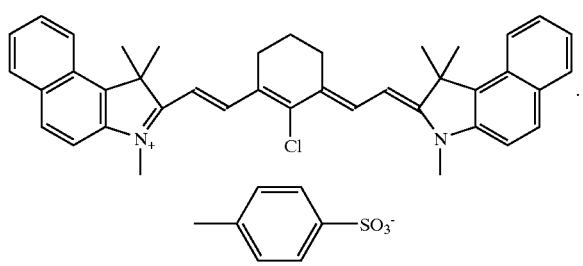

(2)

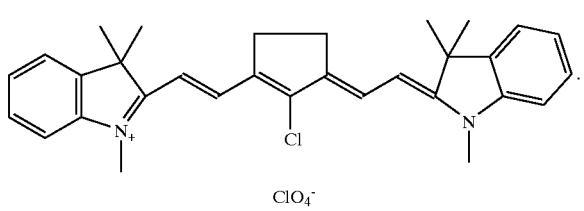

(3)

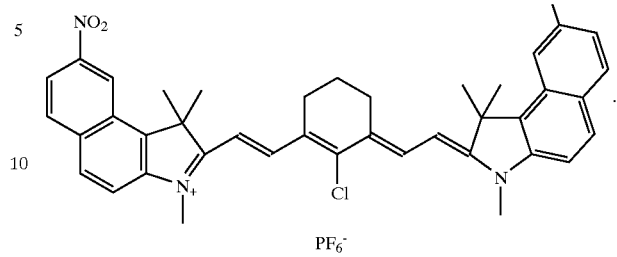

(4)

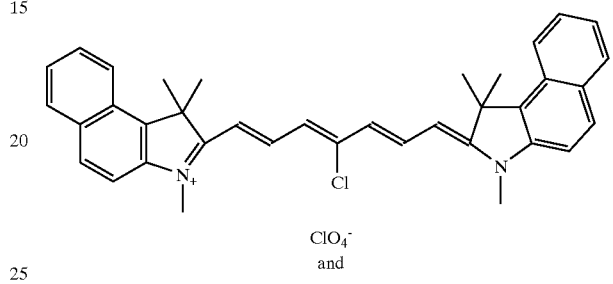

and (5)

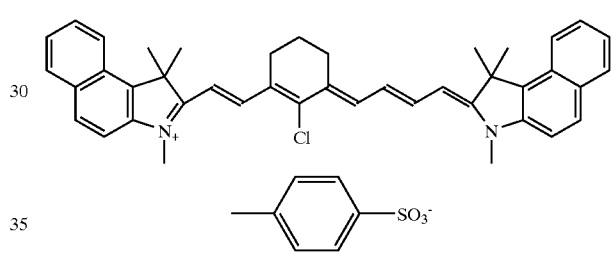

These dyes have the property of generating heat upon absorbing light. Furthermore, they have an infrared absorb band in the range from 700 to 1200 nm and thus, are suitable for use in the thermally imageable compositions of the present invention.

Further examples of dyes and pigments include triarylamine dyes, thiazolium dyes, indolium dyes, oxazolium dyes, cyanine dyes, polyaniline dyes, polypyrrole dyes, polythiophene dyes, thiolene metal complex dyes, carbon black and polymeric phthalocyanine blue pigments and those that are mentioned in U.S. Pat. Nos. 5,919,601; 3,218,167; and 3,884,693, the contents of which are incorporated herein by reference in their entirety as fully set forth.

The present invention also provides an imageable element, which employs the imageable composition of the present invention. The imageable element includes a substrate and an imageable composition according to the present invention coated on a surface of the substrate.

The substrate of the imageable element is typically an aluminum sheet. However, other materials that are commonly known to those skilled in the art can also be used.

Suitable substrates include any sheet material conventionally used to prepare lithographic printing plates, including metals such as aluminum sheets; paper; paper coated on one or both sides with an alpha-olefin polymer such as polyethylene; acetate films such as polyvinyl acetate and cellulose acetate film; polyvinyl acetal film; polystyrene film; polypropylene film; polyester film such as polyethylene terephthalate film; polyamide film; polyimide film; nitrocellulose film; polycarbonate film; polyvinylchloride film;

composite films such as polyester, polypropylene or polystyrene film coated with polyethylene film; metalized paper or films; metal/paper laminates; Perlon gauze; plates of magnesium, zinc, copper, anodized aluminum, electrochemically roughened aluminum, steel, and the like.

A preferred substrate for the imageable element of present invention is an aluminum sheet. The surface of the aluminum sheet may be treated with metal finishing techniques known in the art including physical roughening, electrochemical roughening, chemical roughening, anodizing, and silicate sealing and the like. If the surface is roughened, the average roughness (Ra) is preferably in the range from 0.1 to 0.8 μm, and more preferably in the range from about 0.1 to about 0.4 μm.

The preferred aluminum substrate is electrochemically-grained and anodized aluminum, such as commonly used for lithographic printing plates. Anodized substrates can be prepared using sulfuric acid anodization, phosphoric acid anodization or a combination thereof. Other conventional anodization methods can also be used in the preparation of the anodized substrate of the present invention. The surfaces of these materials can be subjected to a pretreatment, if necessary, using the surface treatment techniques known in the art to improve adhesion between the substrate and organic coatings.

The imageable layer can be applied using the application methods known in the art. For example, the imageable composition can be dissolved in solvents, preferably organic solvents, and applied to an aluminum substrate, which has been preferably grained, anodized and post-treated. Graining (or roughening) can be accomplished by mechanical or electrochemical processes or by a combination of both processes.

After proper drying, the coating weight of the imaging layer preferably is in the range of about 0.2 to about 5.0 $g/m^2$, and more preferably in the range from about 0.7 to about 2.5 $g/m^2$.

The imageable element of the present invention is suitable for use in single as well as multilayer thermally imageable elements that are useful in lithographic printing, including lithographic printing plates that can be thermally imaged by imagewise exposure with a laser or a thermal printing head. The multilayer thermally imageable element is useful as a precursor for a lithographic printing member.

The imageable layer, the imageable element can have additional layers, such as, an underlying layer.

Possible functions of an underlying layer include:

(1) to enhance developability of the imagewise unexposed areas; and (2) to act as a thermal insulating layer for the imagewise exposed areas.

Such thermal insulating polymeric layer prevents otherwise rapid heat dissipation, for example, through the heat conducting aluminum substrate. This allows more efficient thermal imaging throughout of the thermally imageable layer, particularly in the lower sections. In accordance with these functions, the underlying layer should be soluble or at least dispersible in the developer and, preferably, have a relatively low thermal conductivity coefficient.

The thermally imageable element can further have an overlying layer. Possible functions of an overlying layer include:

(1) to prevent damage, such as scratching, of the surface layer during handling prior to imagewise exposure; and (2) to prevent damage to the surface of the imagewise exposed areas, for example, by over-exposure, which could result in partial ablation.

The overlying layer should be soluble, dispersible or at least permeable to the developer.

In a multilayer imageable case, the element has a bottom layer including a polymeric material which can be removed by treatment with an aqueous alkaline solution, and a top layer having the imageable layer of the present invention which upon imaging exhibits a decreased solubility of the exposed regions in an aqueous developer solution, i.e., is negative working.

Further, known plasticizers, adhesion promoters, flow control agents and/or UV absorbers can be added to the copying compositions of the invention. The type and quantity of such additives depend on the purpose for which the imageable element according to the present invention is intended for use. In any case, however, care must be taken that the substances added do not absorb an excessive proportion of the radiation required for acid generation and thus reduce the crosslinking sensitivity of the composition.

Suitable plasticizers include dibutyl phthalate, diisooctyladipate, nitro esters, alkyl and aryl phosphate esters, chlorinated paraffins. Glycols or aliphatic polyols can also be added. If it is desired to ensure good storability under relative high atmospheric moisture conditions, the use of water-insoluble plasticizers is preferred.

Adhesion promoters can also be added. Suitable adhesion promoters include monomeric or polymeric organic silanes, nitrogen-containing heterocyclic compounds, such as those disclosed in U.S. Pat. Nos. 3,645,722, 3,622,234, and 3,827,908, heterocyclic mercaptan compounds, mercapto alkanoic acid anilides and mercapto alkanoic acid esters.

Depending on the manner of exposure of the imageable element to radiation, the thermally imageable composition can optionally include an infrared absorber in addition to the acid curable composition, the acid generator and the strong acid. Thus, when the imagewise exposure of the thermally imageable composition to heat is carried out directly through the physical contact a hot stylus with the thermally imageable composition, the use of an infrared absorber is not necessary. On the other hand, if such imagewise exposure of the thermally imageable composition is carried out by exposing the thermally imageable composition to radiation, such as, an infrared radiation, the use of an infrared absorber is necessary.

Accordingly, the present invention provides:

(1) a first method of producing an imaged element, which includes the steps of:

providing a thermally imageable element including a substrate and a thermally imageable composition coated on a surface of the substrate, the composition including an acid curable composition, an acid generator and a strong acid;

imagewise exposing the imageable element to heat with a hot stylus to produce an imagewise exposed element having exposed and unexposed regions;

baking the imagewise exposed element at a temperature and period of time sufficient to produce a cured element; and contacting the cured element and a developer to remove the unexposed regions and thereby produce the imaged element; and (2) a second method of producing an imaged element, which includes the steps of:

providing an imageable element including a substrate and an imageable composition coated on a surface of the substrate, the composition including an acid curable composition, an acid generator and a strong acid;

imagewise exposing the imageable element to radiation to produce an imagewise exposed element having exposed and unexposed regions;

baking the imagewise exposed element at a temperature and period of time sufficient to produce a cured element; and contacting the cured element and a developer to remove the unexposed regions and thereby produce the imaged element.

The second method can be practiced by imagewise exposing the imageable element to ultraviolet radiation provided that the thermally imageable composition includes a photothermal converting material. However, the exposing step of this method is preferably carried out using an infrared laser. Other methods such as visible or UV laser imaging may also be used, provided that a photoconverter, i.e., a photothermal converter, is present. Thus, for exposure with such visible or UV radiation sources, the imageable composition generally includes a photothermal converting material.

The printing plates, forms, screens, resists and the like, are prepared in the customary manner from the appropriate materials. After exposure, the non-image areas of the layer, which have retained their solubility, are removed by treatment with a suitable developer, such as, an aqueous acid or base solution.

The imaging layer of the imageable element is negative working. Preferably, the imaging layer is thermally imageable, so that the imageable element according to the present invention is infrared radiation imageable. Thus, in the method of the present invention, the step of imagewise exposing the imageable element to radiation is carried out using an infrared radiation. Upon such imaging the developer solubility of the imaged area is decreased to allow differentiation between imaged and non-imaged areas upon development.

Following imagewise exposure by analog or digital means, an imaged element having exposed areas and complimentary unexposed areas is obtained. Thereafter, the exposed plate precursor is baked at a temperature from about 220° F. to about 280° F., preferably from about 240° F. to about 260° F. for a period of time from about 45 seconds to about 75 seconds, preferably from about 55 seconds to about 65 seconds. The exposed plate precursor is then developed with a developer to selectively remove the uncrosslinked materials in the unexposed regions.

The developer composition is dependent on the nature of the polymeric substance, but is preferably an aqueous composition. Common components of aqueous developers include surfactants, chelating agents, such as, salts of ethylenediamine tetraacetic acid, organic solvents, such as, benzyl alcohol, ethylene glycol monomethyl ether, ethylene glycol monoethyl ether, diacetone alcohol, butyl acetate, ethylene glycol methyl ether acetate, methyl isobutyl ketone and a mixture thereof, and alkaline components, such as organic amines, including alkanol amines, such as triethanol amine and methyl diethanol amine, inorganic metasilicates, organic metasilicates, hydroxides and bicarbonates.

The pH of the aqueous developer is preferably within about 5 to about 14, depending on the nature of the composition of the imaging layer. The development can be performed by any known manner, for instance, by rubbing the plate surface with a developing pad containing the foregoing developer or by pouring the developer on the plate surface and then rubbing the surface with a developing brush in water.

The inventors have surprisingly discovered that incorporating a small amount of a sulfonic acid into pre-heat, thermal plate increases the speed of the thermal plate and allows maximum image density at wider pre-heat temperatures. In addition, it provides significantly improved processing latitude while maintaining an adequate shelf life.

For example, when an experiment was completed adding 0 to 1% 3-benzoyl-4-hydroxy-6-methoxybenzenesulfonic acid (HMBS) into a series of coatings for thermal pre heat plates, dramatic increases in speed were found at 0.04% level. In addition the formulation had a 30 to 40° F. pre heat window. With pre heat plates including the 3-benzoyl-4-hydroxy-6-methoxybenzene sulfonic acid (HMBS), the plate speed was around 80 mJ/cm$^{-2}$ with a 250° F. pre-heat temperature, when the plate system was developed in MX1710.

The present invention further provides an improved formulating scope. Previous attempts to improve speed and fog control have had deleterious effects on plate performance. Thus, if one is able to prepare a fast plate, a plate having a poor shelf life is obtained. Conversely, if a plate having a good shelf life is prepared, a slow plate is obtained. In contrast, the present invention provides a substantial improvement in the speed and processing robustness of thermal, pre-heated, negatively working patterning compositions, such as, printing plates, forms, screens, resists, and the like, while maintaining adequate shelf life, improvements in plate speed and increased processing latitude of thermal, pre-heat negative plates.

The invention is further described in the following examples, which are intended to be illustrative and not limiting.

EXAMPLES

The following are referred to hereinafter:
(1) Resin A—a resole resin, UCAR phenolic resin BKS-5928 as supplied by Union Carbide Corporation.
(2) Resin B—a novolak resin, N-9P as supplied by Eastman Kodak Company.
(3) Acid generator A—Diazo MSPF6 as supplied by Diversitec Corporation, Fort Collins, Colo. having the following structure:

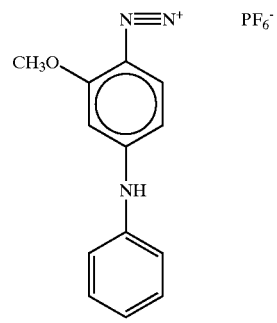

(4) IR dye A—having the following structure:

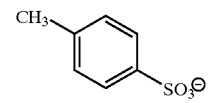
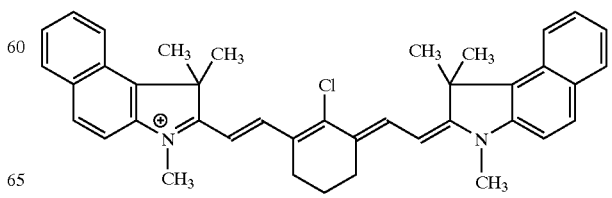

(5) Blue dye A—Simbase Victoria Blue FBO 23363, as supplied by Charkit Chemical Corporation, Darien, Conn.
(6) Terephthaldehyde as supplied by Aldrich Chemical Company, Milwaukee, Wis.
(7) XDSA, having the following structure:

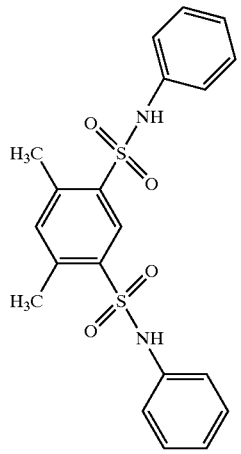

(8) HMBS—3-benzoyl-4-hydroxy-6-methoxybenzenesulfonic acid as supplied by Aldrich.
(9) Substrate—0.3 mm thick sheets of aluminum that had been electrograined, anodised and post-anodically treated with an aqueous solution of an inorganic phosphate.
(10) Developer A-MX1710 as supplied by Kodak Polychrome Graphics.
(11) Creo trendsetter 3244: a commercially available platesetter, operating at a wavelength of 830 nm, as supplied by Creo products of Canada.
(12) Gretag Macbeth D19C densitometer: a commercially available densitometer as supplied by Color data systems Limited of the Wirral, UK.

Examples C1, 1 to 4

Coating formulations included solutions in 1-methoxypropan-2-ol/acetone 97:3 (w:w) of the components described in Table 1. Plates were prepared by coating the formulations onto the aluminum substrate by means of a wire wound bar. The formulation concentrations were selected to provide dry films having a coating weight of 120 mg/ft. The film weights were measured after thorough air drying over several days.

TABLE 1

| | Parts by Weight Example | | | | |
|---|---|---|---|---|---|
| Component | C1 | 1 | 2 | 3 | 4 |
| Resin A | 39.99 | 39.97 | 39.89 | 39.79 | 39.59 |
| Resin B | 51.23 | 51.20 | 51.11 | 50.97 | 50.71 |
| Acid Generator A | 2.57 | 2.57 | 2.56 | 2.56 | 2.55 |
| IR Dye A | 2.77 | 2.77 | 2.76 | 2.75 | 2.74 |
| Terephthaldehyde | 2.28 | 2.28 | 2.28 | 2.27 | 2.26 |
| Blue Dye A | 0.30 | 0.30 | 0.30 | 0.30 | 0.30 |
| XDSA | 0.86 | 0.86 | 0.86 | 0.86 | 0.85 |
| HMBS[a] | — | 0.05 | 0.24 | 0.50 | 1.00 |

[a]HMBS: 3-benzoyl-4-hydroxy-6-methoxybenzenesulfonic acid

The plates were then imaged on the Creo Trendsetter at 76, 81, 86, 93, 100, 109 and 119 mJ/cm$^{-2}$, using an internal solid image pattern (100% exposure). After imaging the plates were heated in a forced air oven at 250° F. for 1 minute, cooled and processed in a mechanical processor using developer A. The solid density ($D_{max}$) of the remaining coating was then measured using the Gretag densitometer. The results are shown in Table 2 below.

TABLE 2

| | $D_{max}$ at stated imaging energy density (mJ/cm$^{-2}$) | | | | | | |
|---|---|---|---|---|---|---|---|
| Example | 76 | 81 | 86 | 93 | 100 | 109 | 119 |
| C1 | 0.55 | 0.56 | 0.72 | 0.96 | 1.06 | 1.27 | 1.39 |
| 1 | 0.58 | 0.66 | 0.91 | 1.10 | 1.24 | 1.40 | 1.41 |
| 2 | 1.08 | 1.26 | 1.39 | 1.41 | 1.41 | 1.41 | 1.41 |
| 3 | 1.27 | 1.34 | 1.41 | 1.39 | 1.41 | 1.41 | 1.41 |
| 4 | 1.31 | 1.35 | 1.39 | 1.39 | 1.39 | 1.39 | 1.39 |

Table 2 shows that addition of sulfonic acid reduces the amount of imaging energy required to achieve an exposed negative working coating.

Further, plate samples of examples C1 and 1 to 4 were aged in an environmental cabinet (80% RH, 104 F) for 5 and 10 days prior to imaging, pre-heating and processing. After processing these aged plates were also read via the Gretag densitometer.

The results are summarized in Table 3.

TABLE 3

| | $D_{max}$ at stated imaging energy density (mJ/cm$^{-2}$) | | | | | | |
|---|---|---|---|---|---|---|---|
| Example | 76 | 81 | 86 | 93 | 100 | 109 | 119 |
| Aged 5 days | | | | | | | |
| C1 | 0.84 | 1.10 | 1.32 | 1.42 | 1.45 | 1.44 | 1.44 |
| 1 | 1.08 | 1.29 | 1.37 | 1.46 | 1.46 | 1.48 | 1.46 |
| 2 | 1.15 | 1.36 | 1.50 | 1.53 | 1.53 | 1.52 | 1.54 |
| 3 | 1.45 | 1.51 | 1.52 | 1.53 | 1.53 | 1.52 | 1.52 |
| Aged 10 days | | | | | | | |
| C1 | 0.77 | 1.11 | 1.39 | 1.47 | 1.51 | 1.51 | 1.51 |
| 1 | 1.08 | 1.36 | 1.49 | 1.51 | 1.51 | 1.55 | 1.56 |
| 2 | 1.16 | 1.35 | 1.42 | 1.43 | 1.51 | 1.51 | 1.53 |
| 3 | 1.47 | 1.54 | 1.52 | 1.50 | 1.53 | 1.52 | 1.50 |
| 4 | 1.36 | 1.49 | 1.54 | 1.55 | 1.53 | 1.53 | 1.53 |

Table 3 shows that the presence of the sulfonic acid does not affect the characteristic aging of the plates. The addition of sulfonic acid continues to reduce the amount of imaging energy required to achieve an exposed negative working coating with aged plates.

The effect of the sulfonic acid on the pre-heating latitude of the plate system, was investigated using plate samples from examples C1 and 1. The plates were imaged on the Creo Trendsetter as described above. After imaging, the plates were heated in a forced air oven at 245, 250, 255, 260, 265 and 270 F for 1 minute, cooled and processed as previously described. The solid density ($D_{max}$) of the remaining coating was then measured using the Gretag densitometer.

The results can be seen in Table 4 below.

TABLE 4

| | $D_{max}$ at stated imaging energy density (mJ/cm$^{-2}$) | | | | | | |
|---|---|---|---|---|---|---|---|
| | 76 | 81 | 86 | 93 | 100 | 109 | 119 |
| Pre-heat = 245 F | | | | | | | |
| C1 | 0.61 | 0.62 | 0.63 | 0.69 | 0.89 | 1.07 | 1.33 |
| 1 | 0.68 | 0.84 | 1.11 | 1.19 | 1.35 | 1.39 | 1.45 |
| Pre-heat = 250 F | | | | | | | |
| C1 | 0.61 | 0.63 | 0.65 | 0.65 | 1.04 | 1.34 | 1.50 |
| 1 | 0.75 | 1.13 | 1.23 | 1.37 | 1.49 | 1.55 | 1.57 |
| Pre-heat = 255 F | | | | | | | |
| C1 | 0.64 | 0.69 | 0.81 | 0.95 | 1.19 | 1.39 | 1.47 |
| 1 | 1.08 | 1.32 | 1.44 | 1.51 | 1.54 | 1.55 | 1.55 |
| Pre-heat = 260 F | | | | | | | |
| C1 | 0.75 | 0.9 | 1.05 | 1.18 | 1.34 | 1.43 | 1.47 |
| 1 | 1.16 | 1.31 | 1.45 | 1.48 | 1.52 | 1.54 | 1.56 |
| Pre-heat = 265 F | | | | | | | |
| C1 | 1.07 | 1.17 | 1.33 | 1.35 | 1.41 | 1.43 | 1.45 |
| 1 | 1.44 | 1.47 | 1.53 | 1.55 | 1.55 | 1.57 | 1.58 |
| Pre-heat = 270 F | | | | | | | |
| C1 | 1.36 | 1.42 | 1.47 | 1.52 | 1.54 | 1.57 | 1.56 |
| 1 | 1.44 | 1.48 | 1.50 | 1.51 | 1.53 | 1.53 | 1.53 |

Table 4 shows that for a given imaging energy density, the presence of the sulfonic acid allows maximum image density at lower pre-heat temperatures.

The present invention has been described with particular reference to the preferred embodiments. It should be understood that variations and modifications thereof can be devised by those skilled in the art without departing from the spirit and scope of the present invention. Accordingly, the present invention embraces all such alternatives, modifications and variations that fall within the scope of the appended claims.

What is claimed is:

1. An imageable composition comprising:

an acid curable composition;

an acid generator; and a sulfonic acid represented by the formula R—SO$_3$H, wherein R is a substituted or unsubstituted hydrocarbyl of 1 to 22 carbon atoms, or a substituted or unsubstituted aryl of 6 to 22 carbon atoms.

2. The composition of claim 1, wherein said acid curable composition comprises:

a crosslinkable binder; and a crosslinking agent for said binder.

3. The composition of claim 2, wherein said binder comprises a polymer having at least two reactive groups each independently selected from the group consisting of: hydroxy, carboxylic acid, amine, carbamate, amide, sulfonamide and imide.

4. The composition of claim 2, wherein said binder comprises a polymer having at least two reactive hydroxy groups.

5. The composition of claim 2, wherein said binder comprises a polymer selected from the group consisting of: a polyol, a polyether polyol, a novolak resin, a resole resin, a hydroxyfunctional acrylic resin, a hydroxyfunctional polyester resin and combination thereof.

6. The composition of claim 2, wherein said binder comprises a novolak resin.

7. The composition of claim 2, comprising a crosslinking agent selected from the group consisting of: a resole resin, an amino resin, an amido resin, an epoxy compound having at least two epoxide groups and a combination thereof.

8. The composition of claim 2, wherein said crosslinking agent comprises a resole resin.

9. The composition of claim 2, wherein said crosslinking agent comprises an amino resin having at least two alkoxymethyl groups.

10. The composition of claim 9, wherein said amino resin is selected from the group consisting of: an alkoxymethylated melamine resin, an alkoxymethylated benzoguanamine resin, an alkoxymethylated glycoluril, an alkoxymethylated polyacrylamid, an alkoxymethylated polymethacrylamid and a combination thereof.

11. The composition of claim 9, wherein said amino resin is an alkoxymethylated melamine resin having from about 2 to about 6 methoxymethyl groups.

12. The composition of claim 2, further comprising an isocyanate crosslinker having at least two isocyanate groups.

13. The composition of claim 1, wherein said acid generator is an ultraviolet, visible or infrared radiation or heat activated compound.

14. The composition of claim 1, comprising an acid generator selected from the group consisting of: an onium salt, a covalently bound sulfonate group containing compound, hydrocarbylsulfonamido-N-hydrocarbyl sulfonate and a combination thereof.

15. The composition of claim 1, wherein said acid generator comprises an onium salt.

16. The composition of claim 15, wherein said onium salt has a non-nucleophilic counteranion selected from the group consisting of: tetrafluoroborate, hexafluorophosphate, hexafluoroarsenate, hexafluoroantimonate, triflate, tetrakis (pentafluorophenyl)borate, pentafluoroethyl sulfonate, p-methylbenzene sulfonate, ethyl sulfonate, trifluoromethyl acetate and pentafluoroethyl acetate.

17. The composition of claim 15, wherein said onium salt is selected from the group consisting of: an iodonium salt, a sulfonium salt, a hydrocarbyloxysulfonium salt, a hydrocarbyloxyammonium salt, an aryl diazonium salt and a combination thereof.

18. The composition of claim 15, wherein said onium salt is a salt of an N-hydrocarbyloxy substituted nitrogen containing heterocyclic compound.

19. The composition of claim 15, wherein said onium salt is N-ethoxyisoquinolinium hexafluorophosphate.

20. The composition of claim 15, wherein said onium salt is 4-octyloxyphenyl phenyliodonium hexafluoroantimonate.

21. The composition of claim 1, wherein said acid generator is a monomeric or oligomeric aromatic diazonium salt.

22. The composition of claim 21, wherein said diazonium salt is selected from the group consisting of: 2-methoxy-4-phenylaminobenzene diazonium hexafluorophosphate (diazo MSPF6) represented by the formula:

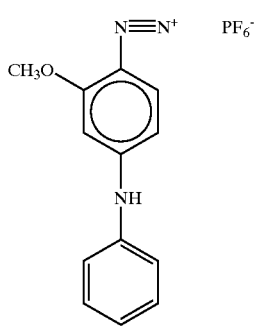

2-methoxy-4-phenylaminobenzenediazonium p-toluenesulfonate represented by the formula:

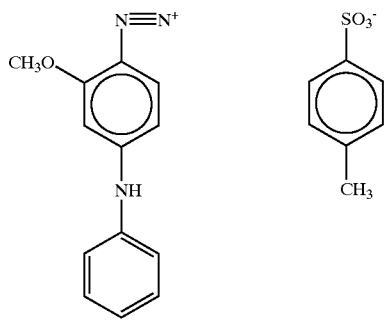

an oligomeric diazonium salt selected from the group consisting of compounds represented by the formula:

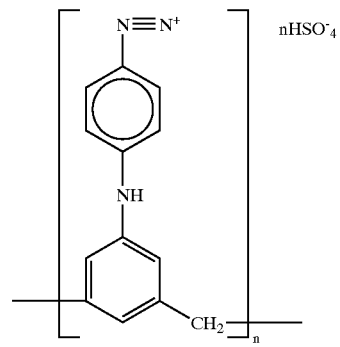

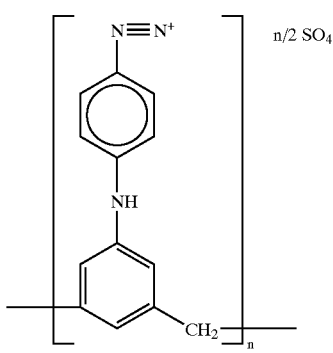

and

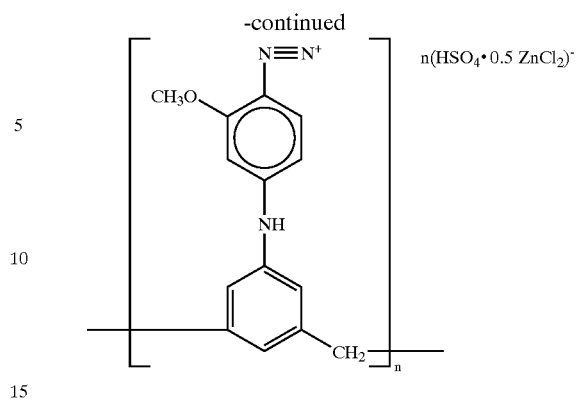

wherein n is from 1 to 11; and a combination of any of the aforementioned compounds.

23. The composition of claim 1, wherein said sulfonic acid is an acid having a pKa of not more than about 5.

24. The composition of claim 1, wherein said sulfonic acid is an acid having a pKa of not more than about 4.

25. The composition of claim 1, wherein R is selected from the group consisting of: linear, branched or cyclic alkyl of 1 to 22 carbon atom, linear, branched or cyclic haloalkyl of 1 to 22 carbon atom having at least one halogen and a mixture thereof.

26. The composition of claim 1, wherein said sulfonic acid is an aryl sulfonic acid represented by the formula:

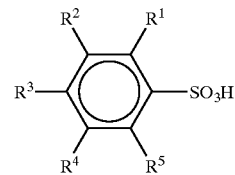

wherein each of $R^1$, $R^2$, $R^3$, $R^4$ and $R^5$ is independently selected from the group consisting of: hydrogen, alkyl of 1 to 12 carbon atoms, haloalkyl of 1 to 22 carbon atoms having at least one halogen, aryl of 6 to 12 carbon atoms, halogen, hydroxy, alkoxy, cyano, nitro, alkoxycarbonyl and acyl.

27. The composition of claim 26, wherein said acyl is represented by the formula:

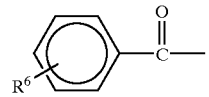

wherein $R^6$ is selected from the group consisting of: hydrogen, alkyl of 1 to 12 carbon atoms, haloakyl of 1 to 12 carbon atoms having at least one halogen, alkoxy, cyano, nitro, alkoxycarbonyl and acetyl.

28. The composition of claim 1, wherein said sulfonic acid is represented by the formula:

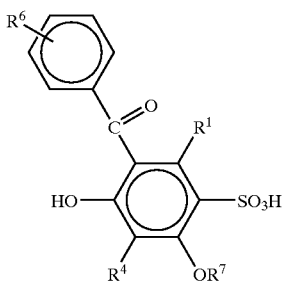

wherein each of $R^1$, $R^4$ and $R^6$ is independently selected from the group consisting of: hydrogen, alkyl of 1 to 12 carbon atoms, haloalkyl of 1 to 12 carbon atoms having at least one halogen, aryl of 6 to 12 carbon atoms, halogen, hydroxy, alkoxy, cyano, nitro, alkoxycarbonyl and acyl and wherein $R^7$ is selected from the group consisting of: hydrogen, alkyl of 1 to 12 carbon atoms, haloalkyl of 1 to 12 carbon atoms having at least one halogen, aryl of 6 to 12 carbon atoms, alkoxycarbonyl and acyl.

29. The composition of claim 1, wherein said sulfonic acid is 3-benzoyl-4-hydroxy-6-methoxybenzenesulfonic acid.

30. The composition of claim 1, further comprising a photothermal converter material.

31. The composition of claim 1, further comprising an infrared absorber.

32. The composition of claim 31, wherein said infrared absorber is selected from the group consisting of: a pigment, a dye and a combination thereof.

33. An imageable element comprising:
  a substrate; and
  an imageable composition coated on a surface of said substrate, said composition comprising: an acid curable composition; an acid generator; and a sulfonic acid represented by the formula R—$SO_3H$, wherein R is a substituted or unsubstituted hydrocarbyl of 1 to 22 carbon atoms, or a substituted or unsubstituted aryl of 6 to 22 carbon atoms.

34. The imageable element of claim 33, wherein said imageable composition comprises an infrared absorber.

35. The imageable element of claim 33, wherein said imageable composition comprises a photothermal converting material.

36. A method of producing an imaged element comprising the steps of:
  providing a thermally imageable element comprising a substrate and a thermally imageable composition coated on a surface of said substrate, said composition comprising an acid curable composition, an acid generator and a sulfonic acid represented by the formula R—$SO_3H$, wherein R is a substituted or unsubstituted hydrocarbyl of 1 to 22 carbon atoms, or a substituted or unsubstituted aryl of 6 to 22 carbon atoms;
  imagewise exposing said imageable element to heat with a hot stylus to produce an imagewise exposed element having exposed and unexposed regions;
  baking said imagewise exposed element at a temperature and period of time sufficient to produce a cured element; and
  contacting said cured element and a developer to remove the unexposed regions and thereby produce said imaged element.

37. A method of producing an imaged element comprising the steps of:
  providing an imageable element comprising a substrate and an imageable composition coated on a surface of said substrate, said composition comprising an acid curable composition, an acid generator, a strong acid, and an infrared absorber or photothermal converter;
  imagewise exposing said imageable element to radiation to produce an imagewise exposed element having exposed and unexposed regions;
  baking said imagewise exposed element at a temperature and period of time sufficient to produce a cured element; and
  contacting said cured element and a developer to remove the unexposed regions and thereby produce said imaged element.

38. The method of claim 37, wherein said imageable composition comprises an infrared absorber.

39. The method of claim 37, wherein said imageable composition comprises a photothermal converter.

40. The method of claim 37, wherein said exposing step is carried out using an infrared laser.

41. The imageabole element of claim 33, wherein the substrate is an aluminum sheet.

42. The method of claim 37, wherein the acid curable composition comprises:
  a crosslinkable binder; and
  a crosslinking agent for said binder.

43. The method of claim 42, wherein said binder comprises a novolak resin.

44. The method of claim 42, wherein said crosslinking agent comprises a resole resin.

45. The method of claim 37, wherein said strong acid is an acid having a pKa of not more thean about 5.

46. The method of claim 37, wherein said strong acid is an acid having a pKa of not more thean about 4.

47. The method of claim 37, wherein said strong acid is a sulfonic acid.

48. The method of claim 37, wherein said strong acid is a sulfonic acid represented by the formula R—$SO_3H$, wherein R is a substituted or unsubstituted hydrocarbyl or 1 to 22 carbon atoms, or a substituted or unsubstituted aryl of 6 to 22 carbon atoms.

49. An imageable composition comprising:
  an acid curable composition;
  an acid generator;
  a strong acid; and
  an infrared absorber or photothermal converter.

50. The composition of claim 49, wherein said acid curable composition comprises:
  a crosslinkable binder; and
  a crosslinking agent for said binder.

51. The composition of claim 50, wherein said binder comprises a novolak resin.

52. The composition of claim 50, wherein said crosslinking agent comprises a resole resin.

53. The composition of claim 49, wherein said strong acid is an acid having a pKa of not more than about 5.

54. The composition of claim 49, wherein said strong acid is an acid having a pKa of not more than about 4.

55. An imageable element comprising:
  a substrate; and
  an imageable composition coated on a surface of said substrate, said composition comprising: an acid curable composition; an acid generator; a strong acid; and an infrared absorber or photothermal converter.

56. The imageable element of claim 55, wherein the substrate is an aluminum sheet.

57. An imageable composition comprising:
  an acid curable composition;
  an acid generator; and
  a sulfonic acid having a pKa of not more than about 8.

* * * * *

UNITED STATES PATENT AND TRADEMARK OFFICE
CERTIFICATE OF CORRECTION

PATENT NO. : 6,806,020 B2
DATED : October 19, 2004
INVENTOR(S) : Neil Frederick Haley et al.

It is certified that error appears in the above-identified patent and that said Letters Patent is hereby corrected as shown below:

Column 22,
Lines 28 and 30, delete the word "thean" and replace it with -- than --.

Signed and Sealed this

First Day of February, 2005

JON W. DUDAS
*Director of the United States Patent and Trademark Office*